(12) United States Patent
Burkett et al.

(10) Patent No.: US 11,378,890 B2
(45) Date of Patent: Jul. 5, 2022

(54) COMPENSATING DEPOSITION NON-UNIFORMITIES IN CIRCUIT ELEMENTS

(71) Applicant: Google LLC, Mountain View, CA (US)

(72) Inventors: Brian James Burkett, Santa Barbara, CA (US); Rami Barends, Goleta, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/208,391

(22) Filed: Mar. 22, 2021

(65) Prior Publication Data

US 2021/0208509 A1 Jul. 8, 2021

Related U.S. Application Data

(63) Continuation of application No. 16/325,319, filed as application No. PCT/US2017/064182 on Dec. 1, 2017, now Pat. No. 10,990,017.

(60) Provisional application No. 62/440,566, filed on Dec. 30, 2016.

(51) Int. Cl.
| | |
|---|---|
| *G03F 7/20* | (2006.01) |
| *G03F 1/36* | (2012.01) |
| *G03F 1/70* | (2012.01) |
| *G03F 1/76* | (2012.01) |

(52) U.S. Cl.
CPC ............ *G03F 7/70425* (2013.01); *G03F 1/36* (2013.01); *G03F 1/70* (2013.01); *G03F 1/76* (2013.01)

(58) Field of Classification Search
CPC .......... G03F 7/70425; G03F 1/36; G03F 1/70; G03F 1/76
See application file for complete search history.

(56) References Cited

U.S. PATENT DOCUMENTS

| | | | |
|---|---|---|---|
| 6,402,905 B1 | 6/2002 | Baldwin et al. | |
| 2004/0058255 A1* | 3/2004 | Jessen | G03F 1/70 430/311 |
| 2009/0235224 A1 | 9/2009 | Kim | |
| 2011/0151190 A1 | 6/2011 | Chung et al. | |
| 2013/0157016 A1 | 6/2013 | Kim | |

(Continued)

FOREIGN PATENT DOCUMENTS

| | | |
|---|---|---|
| CN | 103208423 | 7/2013 |
| EP | 1619556 A1 | 1/2006 |

(Continued)

OTHER PUBLICATIONS

CA Office Action in Canadian Appln. No. 3034528, dated Apr. 17, 2020, 3 pages.

(Continued)

*Primary Examiner* — Stewart A Fraser
(74) *Attorney, Agent, or Firm* — Fish & Richardson P.C.

(57) ABSTRACT

A method of fabricating a circuit element, such as a quantum computing circuit element, including obtaining a lithography mask write file that includes mask information characterizing one or more mask features, obtaining a uniformity function that is configured to modify the mask information to compensate for a non-uniform deposition process, applying the uniformity function to the lithography mask write to obtain a modified lithography mask write file, and performing lithography as directed by the modified lithography mask write file.

19 Claims, 6 Drawing Sheets

(56) References Cited

U.S. PATENT DOCUMENTS

2017/0363950 A1 12/2017 Srirannan
2018/0157161 A1 6/2018 Mailfert
2019/0204753 A1 7/2019 Burkett et al.

FOREIGN PATENT DOCUMENTS

| JP | 2001-244181 | 9/2001 |
|----|-------------|--------|
| JP | 2004-118194 | 4/2004 |
| JP | 2008-192675 | 8/2008 |
| WO | WO 2017/202665 | 11/2017 |

OTHER PUBLICATIONS

CA Office Action in Canadian Appln. No. 3034528, dated Nov. 27, 2020, 4 pages.
EP Extended European Search Report in European Appln. No. 19212172.1, dated Apr. 5, 2020, 7 pages.
JP Decision to Grant a Patent in Japanese Appln. No. 2019-510631, dated Apr. 20, 2020, 5 pages (with English translation).
PCT International Preliminary Report on Patentability issued in International Application No. PCT/US2017/064182, dated Dec. 14, 2018, 6 pages.
PCT International Search Report and Written Opinion issued in International Application No. PCT/US2017/064182, dated May 23, 2018, 12 pages.
Villa et al. [online], "Correction masks for thickness uniformity in large-area thin films" May 2000 [retrieved: Jul. 8, 2019], retrieved from: https://www.researchgate.net/publication/5507376, 10 pages.
Zhang et al., "Uniformity Masks Design Method Base on the Shadow Matrix for Coating Materials with Different Condensation Characteristics" The Scientific World Journal. Sep. 2013, 5 pages.
Office Action in Chinese Appln. No. 201780051576.2. dated Jan. 6, 2022, 13 pages (with English translation).

* cited by examiner

COMPENSATING DEPOSITION NON-UNIFORMITIES IN CIRCUIT ELEMENTS

CROSS-REFERENCE TO RELATED APPLICATION

This application is a continuation application of, and claims priority to, U.S. patent application Ser. No. 16/325,319, filed on Feb. 13, 2019, which application is a national stage application under 35 U.S.C. § 371 of PCT International Application No. PCT/US2017/064182, filed Dec. 1, 2017, which claims the benefit under 35 U.S.C. § 119(e) of U.S. Provisional Application Ser. No. 62/440,566, filed on Dec. 30, 2016. The entire contents of the foregoing applications are hereby incorporated by reference.

TECHNICAL FIELD

The present disclosure relates to compensating deposition non-uniformities in circuit elements, such as quantum computing circuit elements.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle+\beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in one aspect, the subject matter of the present disclosure may be embodied in methods for fabricating a circuit element that include obtaining a lithography mask write file that includes mask information characterizing one or more mask features, obtaining a uniformity function that is configured to modify the mask information to compensate for a non-uniform deposition process, applying the uniformity function to the lithography mask write to obtain a modified lithography mask write file, and performing lithography as directed by the modified lithography mask write file.

In some implementations, the uniformity function includes one or more geometric arguments mapping a set of one or more deposition parameters to the non-uniform deposition process. The uniformity function can include at least one of (a) a radial distribution function and (b) a linear gradient function.

In some implementations, obtaining the uniformity function can include mapping deposition data (e.g., a resistance profile of at least one deposited junction) from the non-uniform deposition process to a set of one or more deposition parameters. The set of one or more deposition parameters can include at least one of a deposition angle, a deposition material, a deposition rotation, source-to-substrate distance, a top layer resist thickness, and a deposition beam profile.

In some implementations, the lithography mask write file includes geometric and exposure time instructions for defining a pattern in a mask. Applying the uniformity function to modify the lithography mask write file can include modifying a set of geometric features and dwell time instruction specified in the lithography mask write file. Performing lithography as directed by the modified lithography mask write file can include performing lithography on a mask.

In some implementations, the circuit element is a quantum circuit element including, for example, a Josephson junction.

In some implementations, the uniformity function is obtained by a data processing apparatus. A data processing apparatus can apply the uniformity function to the lithography mask write file to obtain the modified lithography mask write file.

In some implementations, methods for fabricating circuit elements includes depositing a resist layer onto a substrate, where as directed by the modified lithography mask write file includes performing lithography on the resist layer as directed by the modified lithography write file to fabricate a first resist mask. The first resist mask can be developed and a first deposition of a layer performed through the first resist mask at a first deposition angle. Surface oxidation can be performed on the first deposited layer and a second deposition through the first resist mask can be performed at a second deposition angle. The first resist mask and deposited layers can then be processed to lift-off the first resist mask and excess deposited material to form the circuit element.

In some implementations, fabricating the circuit element includes depositing one or more resist layers onto a substrate, where performing lithography as directed by the modified lithography mask write file includes performing lithography on the one or more resist layers as directed by the modified lithography write file to fabricate one or more resist masks. The one or more resist masks can be developed and one or more depositions can be performed through the one or more resist masks, where the depositions include one or more deposition parameters. The one or more resist masks and deposited layers can be processed to lift-off the resist masks and excess deposited material to form the circuit element. In general, in some aspects, the subject matter of the present disclosure may be embodied in a system including a data processing apparatus, a non-transitory memory storage in data communication with the data processing apparatus which stores instructions executable by the data processing apparatus and that upon execution causes the data processing apparatus to perform operations including obtaining a lithography mask write file including mask information characterizing at least one mask feature, obtaining a uniformity function configured to modify the mask information characterizing the at least one mask feature to compensate for a non-uniform deposition process, and applying the uniformity function to the lithography mask write file to obtain a modified lithography mask write file.

In some implementations, the modified lithography mask write file characterizes a design pattern for a quantum computing circuit element.

In another aspect, the subject matter of the present disclosure relates to improving Josephson junction resistance uniformity. Improving the junction resistance uniformity may include applying a uniformity function to modify at least one mask feature, as defined by a lithography mask write file, such that the modified mask feature compensates for a non-uniformity in a deposition process. For example, the uniformity function may increase or decrease one or more dimensions of the mask feature, resulting in an increase or decrease of a resistance value of a feature to be formed using the modified mask feature. The at least one modified mask feature may include a feature that defines part of a Josephson junction. The uniformity function may be derived from deposition data, from resistances of previously formed Josephson junctions, or from one or more geometric arguments mapping known deposition parameters to the non-uniform deposition process, or a combination thereof. A geometric argument may be understood to include a geometric relationship between one or more deposition parameters (e.g., source-to-beam distance) and one or more deposition conditions (e.g., deposition thickness across a substrate) resulting from the one or more deposition parameters. Mapping a deposition parameter to the non-uniform deposition process therefore establishes a geometric relationship between the one or more deposition parameters and the one or more deposition conditions resulting from the one or more deposition parameters.

The junction resistance of a Josephson junction is inversely proportional to the cross-sectional area of the junction. Gradients in the deposition conditions of the junction width and thickness result in variability in the junction resistance for deposited Josephson junctions across a substrate. The resistances of the deposited Josephson junctions across the substrate are measured and gradients associated with deposition non-uniformity are derived from the measured resistances. A non-uniformity compensation function then may be generated by parameterizing the identified gradients into at least a radial distribution function and/or a vector-valued function.

A uniformity function may be used to modify a lithography mask write file for a lithography tool (e.g., an electron beam lithography (EBL) system). The lithography mask write file can be modified such that certain feature dimensions and patterning elements are modified to compensate for the non-uniform deposition across a substrate. The modified lithography mask write file can then be used to perform lithography to define a mask. The mask may then be used for performing deposition through the mask. For example, a deposition of multiple Josephson junctions on a substrate using this technique would exhibit improved uniformity of junction resistance.

Implementations may include one or more of the following advantages. For example, in some implementations, the techniques disclosed herein may be used to improve uniformity of performance and/or uniformity of deposition across multiple Josephson junctions on a substrate. In some implementations, the presently disclosed techniques improve overall uniformity of performance of quantum computing circuit elements by compensating for fabrication variations across a substrate. For example, the presently disclosed techniques may compensate for film thickness variations between a Josephson junction fabricated at an edge of a substrate and a Josephson junction fabricated near a center point of the substrate. In some implementations, improving uniformity of deposition across multiple Josephson junctions on a substrate facilitates the use of a global microwave drive method for driving/operating a set of two or more qubits using a single controller.

In some implementations, the presently disclosed techniques facilitate quantum hardware design and fabrication by using a data processing apparatus (e.g., computer) to generate a uniformity function and modify a lithography mask write file from deposition parameter inputs and a lithography mask write file. Additionally, the data processing apparatus may generate one or more uniformity functions that can be applied to many different lithography mask write files, rather than having to make modifications to each deposition layout manually. In some implementations, the one or more generated uniformity functions generated by a data processing apparatus may reduce or eliminate a number of calibration steps that must be taken for a set of different device layouts. For example, a uniformity function may be applied to one or more lithography mask write files for multiple different device fabrication layouts. After a uniformity function is generated for a set of deposition parameters, the uniformity function may be used to modify lithography mask write files for a new device layout without necessitating a new calibration step for the new device layout.

The details of one or more embodiments are set forth in the accompanying drawings and the description below. Other features and advantages will be apparent from the description, the drawings, and the claims.

BRIEF DESCRIPTION OF THE DRAWINGS

Like reference symbols in the various drawings indicate like elements.

DETAILED DESCRIPTION

Quantum computing entails coherently processing quantum information stored in the quantum bits (qubits) of a quantum computer. Superconducting quantum computing is a promising implementation of quantum computing technology in which quantum circuit elements are formed, in part, from superconductor materials. Superconducting quantum computers are typically multilevel systems, in which only the first two levels are used as the computational basis. In certain implementations, quantum computing circuit elements, such as qubits, are operated at very low temperatures so that superconductivity can be achieved and so that thermal fluctuations do not cause transitions between energy levels. Additionally, it may be preferable that the quantum computing circuit elements are operated with low energy loss and dissipation (e.g., the quantum circuit elements exhibit a high quality factor, Q). Low energy loss and dissipation may help to avoid, e.g., quantum decoherence.

Fabrication of integrated quantum computing circuit elements with superconducting components typically involves depositing and patterning superconductor materials, dielectrics and metal layers. Certain quantum computing circuit elements, such as qubits, are constructed using Josephson junctions. A Josephson junction may be made by sandwiching a thin layer of a non-superconductive material between two layers of superconducting material. An exemplary process for fabricating a Josephson junction is described as follows. A photoresist layer is deposited on a substrate and patterned to define opening regions within the resist through which a surface of the substrate is exposed. The opening regions within the resist may be defined by selectively exposing the resist to a source (e.g., light or an electron beam) such that the exposed portions become either soluble or insoluble when treated with a developer solution. For instance, in some implementations, an electron beam is directed onto the resist at predefined locations specified by a lithography mask write file. The lithography mask write file may define, e.g., the geometry and exposure time instructions for the electron beam to follow across the surface of the resist mask. Other exposure techniques, such as ultraviolet light exposure, may be used instead. Subsequent to exposure, the resist mask then is developed to selectively remove either the exposed or non-exposed regions of the resist layer, depending on the type of resist used.

After selectively removing the resist in predefined areas, material that will form a Josephson junction may be deposited within the opened areas and on the remaining resist. For example, in some implementations, a shadow evaporation technique may be used to deposit material that will form portions of the Josephson junction. In particular, the substrate having the patterned resist is placed within a deposition chamber (e.g., a chamber of a physical vapor deposition system) at a first position and is subjected to a first superconductor deposition process. The first superconductor deposition forms a first set of deposited superconductor structures (e.g., a bottom contact for a Josephson junction) on the substrate and within the opened regions of the resist. The substrate surface facing the material being deposited may be oriented at a non-normal angle with respect to a flow direction of the deposition material, such that a portion of the resist near the edge of opened areas blocks the deposition of at least some of the superconductor material within the opened regions.

After the first superconductor deposition step, the substrate may be transferred to air or to a separate chamber where surface oxidation of the superconductor material is promoted. In some implementations, the substrate may be left in the deposition chamber for in-situ oxidation. After oxidation, the substrate then may be subjected to a second superconductor deposition step, in which a second superconductor material is deposited to form a second set of deposition structures (e.g., a top contact for each Josephson junction). For the second superconductor deposition, the substrate may be rotated to a second position different from the first position. Additionally, the substrate surface again may be oriented at a non-normal angle with respect to a flow direction of the deposition material, such that a portion of the resist near the edge of opened areas blocks the deposition of at least some of the superconductor material within the opened regions. The angle of orientation of the substrate surface during the second deposition may be different from the angle of orientation of the substrate surface during the first deposition. For example, in some implementations, the substrate surface may be oriented at a first angle with respect to the flow direction of the deposition material during the first deposition step and at a second angle that is orthogonal to the first angle during the second deposition step.

After the shadow evaporation process, the resist may be removed in a lift-off step to remove unwanted material and complete the fabrication of the Josephson junctions. Lift-off may be performed using various different solvents and/or chemistries depending on the chemical composition of the resist material.

In some cases, the deposition process, such as the shadow evaporation process described herein, deposits material in a non-uniform manner. For example, the deposition process may produce a film of material having a first thickness in one area of the substrate and a second, different, thickness in a second different area of the substrate. The non-uniformity may arise for various reasons including, for example, a variation in the angle of deposition of material relative to the substrate surface. In some cases, the variation may arise due to substrate size (e.g., the angle of deposition will be different for locations near the center of a large substrate than for locations near the edge of the substrate) and/or substrate positioning within a deposition tool. In some cases, a non-uniformity in film thickness across a substrate may arise due to shadowing and/or blocking of a deposition beam in areas of the substrate by a mask on or near the substrate, resulting in areas of the substrate with different film thicknesses than other areas of the substrate.

The non-uniformity in film thickness may adversely affect the performance of circuit elements, such as quantum computing circuit elements. For instance, in some implementations, the non-uniformity in thickness of a deposited superconductor material may affect the performance (e.g., the conductance and/or the inductance) of one or more Josephson junctions at different locations across a substrate. In other words, two or more identically designed Josephson junctions may be non-identical when fabricated, due to non-uniformities of deposition. The two or more non-identical Josephson junctions may then exhibit different junction performance (e.g., conductance and/or inductance) due to the variation in film thickness.

One method for determining non-uniformity of deposition of a Josephson junction may be measuring the resistance of a Josephson junction above the superconducting temperature of the superconducting material of the Josephson junction (e.g., at room temperature). The resistance of the Josephson junction may then be correlated to a non-uniformity of deposition. For example, the resistance of the junction may be inversely proportional to a junction area of the Josephson junction. As an example, for a 3" wafer substrate, a junction resistance of a Josephson junction fabricated near the edge of the wafer may differ from a junction resistance of a Josephson junction fabricated at the center of the wafer, due to a variation in superconducting material deposition thickness at the different locations, by about 10-15%.

Resistance, R, of a junction area of a Josephson junction is proportional to 1/A, where A is the cross-sectional area of a junction formed by an insulator layer (e.g., an oxide layer) between deposited bottom and top contacts. The cross-sectional area of the junction may include an area of the top contact that is in contact with the insulator layer between the top and bottom contacts. The resistance R for the junction may be proportional to $\exp(d/d_0)/A$, where d is the thickness of the insulator layer between the top and bottom contacts, $d_0$ is a constant, and A is the area of the insulator layer in the overlap between the top and bottom contacts.

In some implementations, the thickness d of the insulator layer between the top and bottom contacts (e.g., the oxide layer) is uniform across a substrate, and therefore the exponential dependence on oxide thickness in determining non-uniformity of deposition (and junction resistance) may be ignored. For example, the thickness of an oxide layer may be uniform due to a uniformity in an oxidation process by which the oxide layer is promoted on top of a first deposition of a bottom contact.

The area of the junction depends on an area of overlap between the top and bottom contacts between which there is an insulating (e.g., oxide) layer. The area of overlap between the top and bottom contacts in turn may depend on the relative dimensions (e.g., length, width, height) of the contacts and the location of the contacts relative to each other. Therefore, if the dimensions and relative location of top and bottom contacts varies from Josephson junction to Josephson junction, the different junctions will exhibit different resistances.

Josephson junctions are components of many superconducting quantum computing circuit elements, including qubits. Josephson junctions in a qubit exhibiting different junction performance may directly affect the operating frequency (or phase) of the qubit. For example, the frequency of a qubit including one or more Josephson junctions is inversely proportional to a junction area of the one or more Josephson junctions, such that the frequency is proportional to the square root of the junction area.

Matching the resistances of the Josephson junctions (and therefore the frequencies or phase) may improve controllability and reproducibility of the qubits. Additionally, it may make design and/or layout of one or more qubits on a substrate easier, in part because frequency deviations between qubits may reduce a frequency range over which the one or more qubits may operate. For example, a set of three qubits may be designed to operate with a maximum qubit frequency of 6 GHz, but instead exhibit actual maximum qubit frequencies of 5.7, 5.8 and 6.1 GHz when fabricated due to non-uniformities in a Josephson junction contact deposition process. In certain implementations, such a set of qubits will be limited to operating at the lowest performing qubit (e.g., 5.7 GHz), which is less than the designed maximum qubit frequency of 6 GHz.

Other deposition non-uniformities may affect the operation of superconducting quantum computing circuit devices and include, for example, electrode width, sidewall variation, and resist aperture variation. For example, electrode width may depend in part on the thickness of the one or more resist masks. Additionally, dimensions of one or more resist apertures for a second, subsequent deposition after a first deposition may be altered by a deposition thickness of the first deposition such that one or more electrode widths deposited in the second deposition will be affected.

The present disclosure is directed to compensating for the non-uniformities created by deposition processes in the fabrication of circuit elements, such as quantum computing circuit elements. The compensation techniques described herein may include determining information about the non-uniformity caused by the deposition process, deriving a uniformity function from the non-uniformity information, modifying a lithography mask write file with the uniformity function, and applying the modified mask write file to assist in the fabrication of the circuit element, such as a quantum computing circuit element. The modified mask write file may define one or more features that, when used to fabricate circuit structures, may compensate for the film non-uniformity created by the deposition process.

Figure 1:
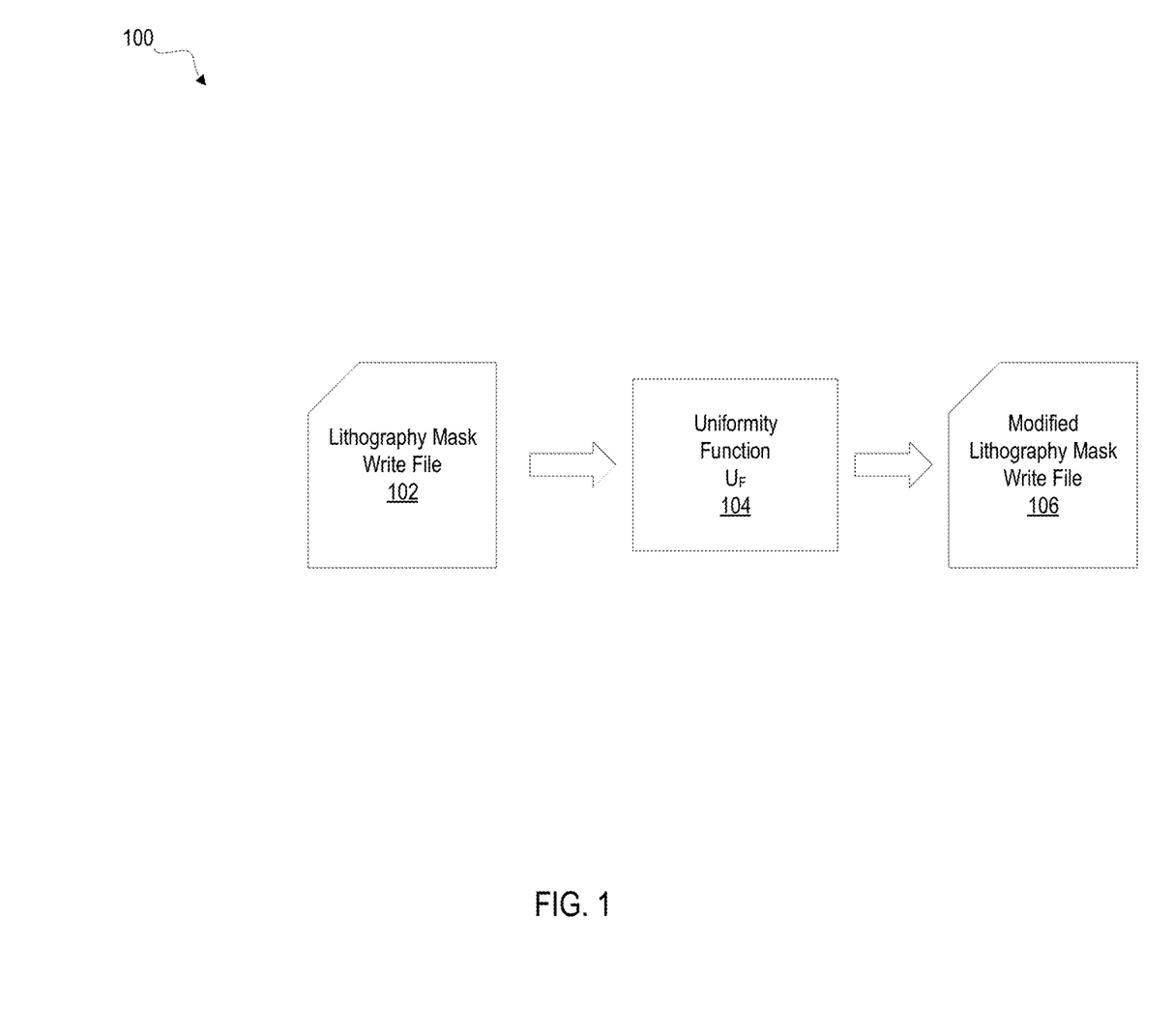
FIG. 1 is a block diagram of an exemplary environment in which an electron beam lithography write file is modified using a uniformity function.

FIG. 1 is a block diagram of an exemplary process 100 for obtaining a modified mask write file. As shown in process 100, a lithography mask write file (LMWF) 102 is provided. The LMWF 102 includes a set of instructions that may be used by a lithography tool (e.g., an electron beam lithography system) to pattern a surface during an exposure process. For example, in the case of an electron beam lithography system, the instructions from LMWF 102 may include instructions for directing and scanning a focused electron beam to define a geometric feature during a resist exposure process. The instructions may also define the feature dimensions of the geometric features to be produced. Feature dimensions include, e.g., radii, curves, lengths, widths, and/or aperture openings, among other feature dimensions. The instructions may also include dwell time instructions that specify the speed of the raster of an electron beam over a surface during the exposure process. In some implementations, the instructions specify how the geometric features defined by the electron beam are arranged along a two-dimensional plane.

In some implementations, a LMWF 102 may include instructions for patterning of three-dimensional features. For example, the LMWF 102 may provide instructions to a lithography system such that a wall of the mask is patterned at a particular angle. In some implementations, the LMWF 102 may include instructions for using low-kV electron beam lithography to pattern three-dimension features including angled openings in a mask.

In some implementations, the fabrication of circuit elements, such as quantum computing circuit elements, may require the use of multiple LMWFs, where each LMWF provides instructions for a different mask to be used in a different fabrication step of a circuit fabrication process. For example, in some implementations, the fabrication of a Josephson junction entails the deposition and patterning of two different resist layers, in which a different mask is applied to each resist layer. The features defined by the different masks may correspond to different aspects of the Josephson junction (e.g., bottom contact or a top contact).

In some implementations, the LMWF 102 includes instructions for defining features to be formed on a photomask instead of instructions for directing an electron beam during e-beam lithography. For example, the LMWF 102 may include instructions executable by computer aided design programs, such as AutoCAD®. The instructions of the LMWF may define the geometric dimensions of features to be formed on the photomask, as well as the arrangement of the features on the photomask.

A uniformity function 104 may be applied to the lithography mask write file 102 to generate a modified lithography mask write file 106. A uniformity function 104 includes one or more functions that modify the lithography instructions of the LMWF 102. The modifications may include alterations to one or more feature defined by the LMWF 102. For example, the modifications may include a change in the geometry and/or size of a feature defined by the LMWF 102. In some implementations, the modifications may include a change in dwell time instructions for an electron beam of the lithography tool. The uniformity function 104 may include a linear function component, a radial dependent component, a non-linear component, or a combination thereof that alters the features defined by the LMWF 102. A linear function component may include, e.g., a function that causes the feature defined by the LMWF 102 to change linearly with the position along the mask. For instance, a width W of a contact line may vary depending on the position X along the mask where the contact line is located as $W=(\frac{1}{2})X$. A radial function component may include, e.g., a function that causes the feature defined by the LMWF 102 to change based on a radial location of the feature within the mask. For instance, a width W of a contact line may vary with a radial position r along the mask where the contact line is located as $W=(\frac{1}{2})r$. A non-linear function component may include, e.g., a function that causes the feature defined by the LMWF 102 to change in a non-linear manner based on the location of the feature within the mask. For instance, a width W of a contact line may vary with a position X along the mask where the contact line is located as $W=(1/2)X^2$.

Generating a uniformity function will be discussed in more detail with reference to FIGS. 2A and 2B below.

In some implementations, a data processing apparatus (e.g., a computer) receives a LMWF 102, and applies a uniformity function 104 to a LMWF 102 to generate a modified LMWF. For example, a LMWF 102 may include instructions for an electron beam lithography tool for patterning a set of features (e.g., contact pads) in a grid layout across a resist mask on a substrate. A computer program on the data processing apparatus may then receive as inputs the LMWF 102 and the uniformity function 104, and apply the uniformity function 104 to the LMWF 102 such that the uniformity function 104 modifies one or more aspects of the features (e.g., size and/or location of the contact pads) to compensate for non-uniformities (e.g., film thickness variation) in the deposition process to be performed.

Applying the uniformity function 104 to the LMWF 102 to create a modified LMWF 106 may include, but is not limited to, applying a function that changes a feature dimension of one or more features defined by the LMWF 102, applying a function that shifts a location of one or more features defined by the LMWF 102 relative to another feature or relative to a specified position within the mask, and/or applying a function that changes a dwell time of an electron beam defined by the LMWF 102. Feature dimensions that may be modified by the uniformity function 104 include, e.g., radii, curves, lengths, widths, and/or aperture openings, among other feature dimensions. In some implementations, a different uniformity function may be applied to each LMWF in a set of LMWFs for fabrication of circuit elements that requires the use of multiple masks.

The feature changes produced by application of the uniformity function 104 to the LMWF 102 compensate for one or more non-uniformities in the deposition process. That is, structures that are fabricated using the modified LMWF 106 as a mask during the fabrication process may have features (e.g., geometric dimensions and/or location on a substrate surface) that are modified to compensate for variations resulting from deposition process (e.g., deposited film thickness variations).

For instance, in some implementations, a LMWF 102 may define the shape and locations of portions of quantum computing circuit elements. As an example, the LMWF 102 may define the shape and location of multiple different Josephson junctions across a mask. In some cases, the LMWF 102 also may specify that the shape of each quantum computing circuit element portion (e.g., each Josephson junction) is the same regardless of location within the mask. As explained herein, junction performance may vary depending on the thickness of the deposited contacts, and the thickness may be correlated with junction resistance, which, in turn, is proportional to a cross-sectional area of an oxide layer between the top and bottom contacts forming the junction. Thus, for the example in which the LMWF 102 defines multiple Josephson junctions a spatial variation in the thickness of the deposited film used to form the contacts (e.g., a variation in deposited film thickness as a function of position across the substrate surface), may result in the fabrication of multiple Josephson junctions one or more of which exhibit different junction resistances depending on the location of the junctions on the substrate. A uniformity function 104 may be applied to the LMWF 102 to produce a modified LMWF 106 that defines a modified shape and/or location of the quantum computing circuit element portions (e.g., the Josephson junction contacts) within the mask. The particular change that is applied to each quantum computing circuit element portion may be different depending on the location of the quantum computing circuit element portion within the mask. Furthermore, the changes applied to the quantum computing circuit element portion take into account the process variations (e.g., deposited film thickness variation) that may occur with fabrication in order to compensate for those variations (e.g., to provide Josephson junction contacts having uniform performance). For example, for a Josephson junction contact on a substrate surface having lower than desired deposited film thickness, the area of the contact along a plane orthogonal to the thickness direction, (as defined by the lithography mask write file), may be increased. Modifying the area of the contact along a plane orthogonal to the thickness direction preserves a total contact area. The increase in contact area may counter the decrease in film thickness. Similar modifications may be applied to other contact structures defined by the lithography mask write file, with the particular change being determined by the expected location of the contact structure and the expected process variation to occur at that location. The modified LMWF 106 then may be used to form a mask that defines the Josephson junction contact areas.

In some implementations, the uniformity function 104 applied to a LMWF 102 may compensate for non-uniformities of two or more depositions in a multi-deposition fabrication process. For example, a first deposition step may have a unique non-uniform process variation relative to other deposition steps within the fabrication process. Differences in non-uniformity of deposition between deposition steps may be due to a variety of factors including, a difference in substrate rotation in the different steps, a difference in the angle of orientation of the substrate surface relative to a deposition beam source, and a difference in shadow effects by the resist mask between deposition steps. A shadow effect may occur when a part of a substrate area is shadowed or obscured by a resist mask such that a deposition beam is limited or blocked from depositing material on the substrate area. Another shadow effect may occur when a surface of deposition of a substrate is angled with respect to the deposition beam such that the deposition beam is shadowed or obscured from depositing material on the substrate area.

In some implementations, one or more deposition steps may affect subsequent depositions. For example, for a first deposition for fabricating a Josephson junction, some amount of material may be deposited on at least a sidewall of a resist mask. For a second, subsequent deposition through the same mask, a deposition beam may be further shadowed by the material previously deposited on one or more sidewalls of the resist mask in the first deposition. The additional shadowing due to the sidewall deposition may limit the amount of deposition possible through the resist mask. This in turn may affect a width of a line that is deposited in the second, subsequent deposition. Changing the width of the deposited line may change the cross-sectional area of the junction and may in turn affect the resistance of the Josephson junction. A uniformity function 104 may reduce the non-uniformity of deposition resulting from the sidewall deposition by modifying a LMWF 102 to generate a modified LMWF (e.g., MLMWF 106).

In some implementations, the LMWF 102 defines a lithography pattern that is copied multiple times across a mask using a stitching process. A different uniformity function 104 may be generated and applied to different regions of the mask defined by the LMWF 102. The particular uniformity function 104 that will be used at each different region may depend on the expected process variation to occur that region. For example, a uniformity function applied to a feature pattern in a region adjacent to a mask edge may differ from a uniformity function applied to the same feature pattern that is located in a region adjacent to a central portion of the mask.

A uniformity function 104 for modifying a LMWF 102 may be generated using one or more different methods. FIGS. 2A, 2B are block diagrams illustrating exemplary processes 200 and 250 for generating uniformity functions from deposition data and from one or more geometric arguments, respectively.

A uniformity function 104 in exemplary process 200 is generated empirically by a calibration process 202 having a fabrication and a characterization step 204. The calibration process 202 includes fabrication (206) of at least one test structure on a substrate and characterization (208) of the at least one test structure. An example of a test structure includes a thin film deposited across at least a portion of the substrate. A test structure may also be a Josephson junction. Other test structures are also possible. Test structures may be deposited directly onto a substrate or may be deposited through a mask. In some implementations, test structures may be deposited onto a substrate and undergo post-processing steps including lithography and/or etching.

The fabrication (206) of the at least one test structure may be performed according to one or more specified depositions parameters $\{D_P\}$ 210. Examples of deposition parameters include, but are not limited to, deposition tool parameters 210-1, deposition conditions 210-2, and geometry of deposited structures 210-3, the details of which will be described further below.

The at least one fabricated test structure then may be characterized (208) to extract deposition data 212. The deposition data 212 may include, in some implementations, non-uniformity deposition results (e.g., non-uniform resistance or film thickness across a substrate). Characterization of at least one fabricated test structure may include, e.g., measuring, directly or indirectly, information about the geometric dimensions of the test structure. For example, a direct characterization of a test structure (e.g., a wire) may use atomic force microscopy (AFM) to measure the geometric dimensions (e.g., width, length, radius, thickness) of the features of the test structure.

An example of an indirect characterization may rely on a four-point probe measurement of the test structure (e.g., a thin film deposited on a substrate of known resistivity). In some implementations, the film thickness t of the film can be extracted from a measured sheet resistance $R_s$ using the relationship: $t=\rho/R_s$, where $\rho$ is bulk resistivity of the material. The sheet resistance $R_s$ may be determined from the four-point probe based on a relationship between the measured voltage V and measured current I between the probes. Another example of an indirect characterization of Josephson junctions may rely on room-temperature DC probing for measurement of resistances across a wafer. The room-temperature DC probing yields an (x,y)-dependent resistance map across the wafer, which can then be used to extract information about the cross-sectional area of the junction.

A set of deposition data $\{D_N\}$ 212 is collected from the characterization of the test structures 208, including information pertaining to non-uniformity in the deposition of the test structures.

The deposition data $\{D_N\}$ 212 then can be used to generate an empirical function $F_E(\{D_N\})$ 214 that maps (210) the deposition parameters for a deposition to the deposition data 212. For instance, the function 214 may define how one or more different deposition parameters may vary over a substrate surface depending on the deposition parameters that are used for the deposition.

For example, the function 214 may characterize certain deposition data (e.g., film thickness) as varying linearly, radially or non-linearly across a substrate surface for different angles at which the substrate surface is oriented with respect to a deposition source. For instance, a linear function may be y=ax+b where y is a deposited film thickness, x is position on a substrate, and a and b are coefficients of non-uniformity. An example of a radial function may be a radial basis function such as a multiquadratic function $\varphi(r)=\sqrt{(1+(\varepsilon r)^2)}$, where $\varphi$ is a deposited film thickness, $\varepsilon$ is a coefficient of non-uniformity, and r is a radial location on a substrate. Another example of a component is a non-linear function such as a cubic function or a quadratic function.

In some implementations, the film thickness is proportional to the material deposited, which is in turn proportional to $n \cdot R = h^2/|R|^2$, where n is the film normal with unity length, and R is the vector from the source to the point on the wafer, with unity length, h is the height of the wafer (e.g., the vertical distance between the source and the wafer center). A deposition beam may be anisotropic, such that the flux of deposited material follows a polynomic function $\theta=\Sigma a_k \theta^k$, where $\theta$ is the smallest angle between R and a source direction. In some implementations, the source direction is a unity vector pointing along the z axis (e.g., (0,0,1)).

For each set of deposition data $\{D_N\}$ 212, the empirical function 214 may be used to generate at least one uniformity function 104. In some implementations, a data processing apparatus (e.g., a computer) may take a set of deposition data 212 and produce an empirical function 214 fitting the deposition data 212, and containing information about deposition non-uniformity. The data processing apparatus may then take as inputs the empirical function 214 and use the established relationship between resistance and cross-sectional area described herein, and generate a uniformity function 104. For each unique set of deposition parameters 210, the deposition data 212 for a calibration process 202 may yield a different empirical function, generating a different uniformity function 104. The uniformity function 104 can then be applied to a LMWF 102 to create a modified LMWF 106.

Alternatively, or in addition, to using an empirical function for generating a uniformity function, a data processing apparatus (e.g., a computer) may formulate one or more geometric arguments 216 to determine a geometric relationship between a deposition parameter and the resulting effects the deposition parameter has on deposition. For example, a geometric argument specifies a geometric relationship between an angle of deposition (e.g., the angle of the surface of a substrate with respect to the deposition beam) and a thickness of deposition across the surface of the substrate.

Additionally, a series of geometric arguments can be formulated to compensate for non-uniformities in deposition. In some implementations, the one or more geometric arguments may be part of a geometric model or geometric simulation. A geometric argument 216 relates one or more deposition parameters 210 to one or more effects on deposition. For example, a geometric argument may specify the effect on deposition thickness across a way as a function of an angle of deposition (e.g., the angle of the surface of a substrate relative to the angle of a deposition beam), such that the non-uniformity is a function of the angle of deposition.

A geometric argument 216 may establish geometric relationships between multiple deposition parameters 210 and the resulting non-uniform deposition. Deposition parameters 210 include deposition tool parameters 210-1, deposition conditions 210-2, and geometry of deposited structures 210-3.

The deposition tool parameters 210-1 vary between deposition tools, and may be adjustable or static depending on the tool. Deposition tools include electron beam evaporation systems, physical vapor deposition systems, atomic layer deposition systems, chemical vapor deposition systems, molecular beam epitaxy systems, and the like. Deposition tool parameters include source-to-substrate distances, deposition rates, range of deposition angles, and deposition beam profile. For example, a larger source-to-substrate distance will ensure a higher degree of uniformity of deposition across a substrate due to a reduced angular dependence of the deposition. However, fewer deposition tools have this feature due to the required overall height of the tool for a large source-to-substrate distance.

Deposition conditions 210-2 include, e.g., deposition angle, a deposition material, and deposition rotation. For example, the location on the substrate of a particular Josephson junction may result in a deposition film thickness variation, due in part to the position and angle of the Josephson junction relative to the beam of depositing material. The deposition conditions may result in side-wall variation, resist aperture variation, deposited film thickness variation, deposited film width and/or length variation, or combinations thereof.

Geometry of deposited structures 210-3 include, parallel strips, crossed wires, coplanar waveguides, concentric circles, concentric squares, angled strips, tapered strips, circles, squares, and the like. In some implementations, the geometry of a set of deposited structures 210-3 additionally affects non-uniformity of the deposited structures. A first deposition on a substrate may affect subsequent depositions on the same substrate by creating additional shadowing affects. For example, a geometry including a two-step deposition process through a resist mask onto a substrate for depositing a pair of crossed wires, where each wire is deposited in a separate deposition step. A first deposition for a first wire may have the additional effect of depositing excess material on top of a resist mask. The first deposition may also result in excess material being deposited on the sidewalls of the resist mask, which may alter the intended dimensions of one or more apertures in the resist mask. A second, subsequent deposition of a second wire may thus have non-uniformities in dimension because of the altered dimensions of one or more apertures in the resist mask.

A geometric function $F_G(\{D_P\})$ 218 may be generated by a data processing apparatus. The geometric function 218 may include one or more geometric arguments 216 that establishes a geometric relationship between a given set of deposition parameters $\{D_P\}$ 210 and a set of simulated non-uniformity effects. The geometric function 218 may include information including film thickness variation, electrode width variation, sidewall variation, and resist aperture variation. The geometric function 218 further incorporates geometric and deposition considerations of the above mentioned deposition parameters. For each set of deposition data 210, the geometric function $F_G(\{D_P\})$ 218 generates at least one uniformity function 104 which can be applied to a LMWF 102 to create a modified LMWF 106.

Though geometric arguments arising from geometry relationships between deposition parameters and deposition characteristics are described in detail, other factors are implicitly included in any fit, and therefore could be compensated for using the techniques described herein. For example, one such factor may be an electron beam lithography tool operating outside its intended parameters (e.g., misalignment, beam defocus, beam energy variation). A uniformity function may additionally compensate for non-uniformity of structures fabricated using the electron beam lithography tool operating outside its intended parameters.

Figure 3:
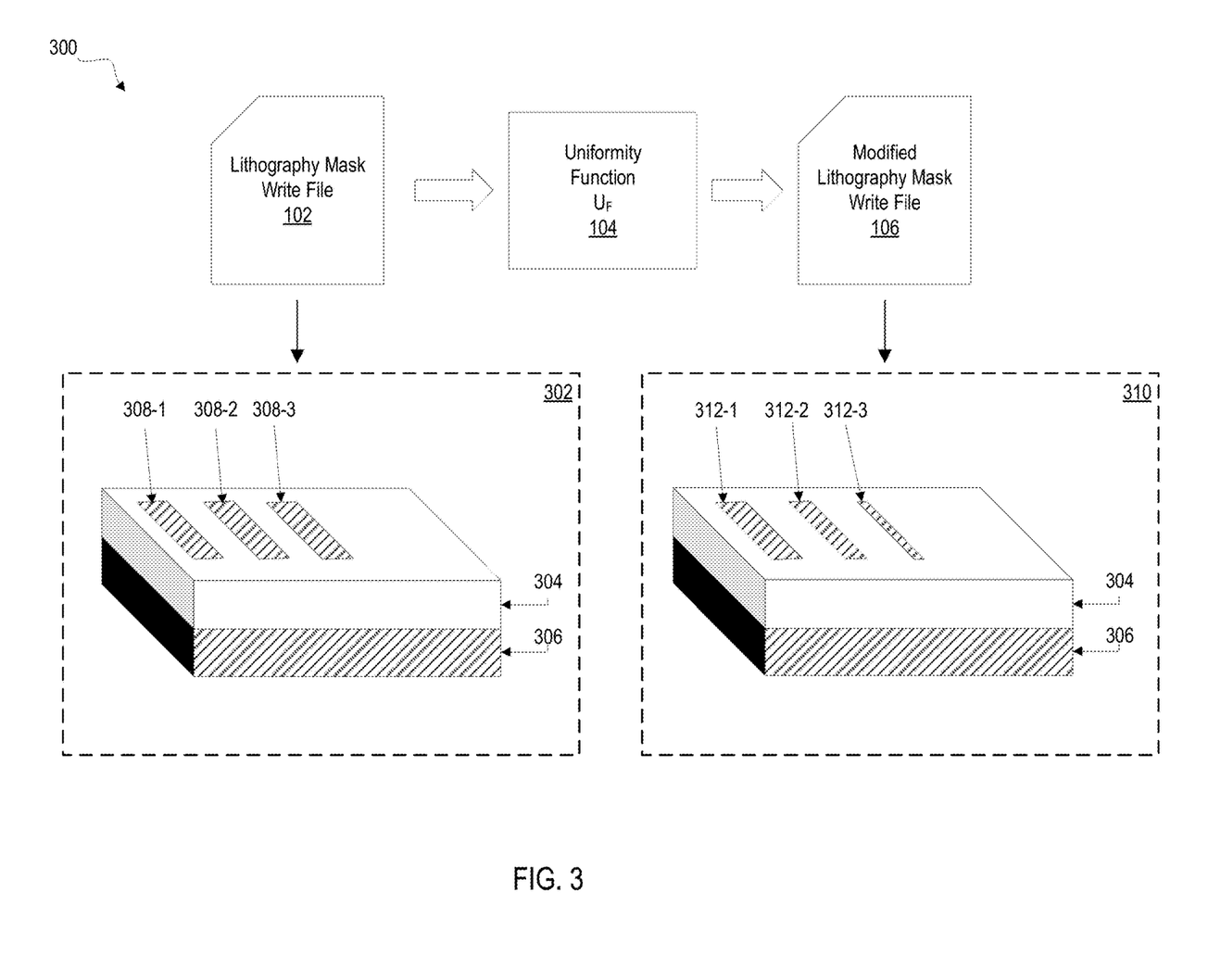
FIG. 3 is a diagram showing exemplary modifications to a mask fabrication using a uniformity function.

FIG. 3 is a diagram showing exemplary modifications to a mask using a uniformity function, such as the uniformity functions described herein. Sample 302 includes a mask 304 on top of a substrate 306 with pattern 308 defined in the mask. As stated herein, a mask, such as mask 304, may include a resist mask. Example mask features 308-1, 308-2, and 308-3 are transferred to the mask 304 using an exposure tool operated according to instructions defined in lithography mask write file 102. The LMWF 102 contains instructions for the lithography tool (e.g., electron beam lithography tool) regarding the dimensions and layout with respect to a substrate of each feature 308-1, 308-2, and 308-3 such that the electron beam may selectively cure the areas where the features occur or the areas where the features do not occur, depending on the type of resist used. The instructions of the LMWF also include a dwell time or speed at which the electron beam rasters the surface, curing through the thickness of the resist layer. As depicted in sample 302, the mask features 308-1, 308-2, and 308-3 are all rectangular features of equal dimensions.

In some implementations, it may be determined, as described above with reference to FIGS. 2A and 2B, that the deposition parameters result in a non-uniform deposition. A uniformity function 104 may be applied to the LMWF 102 to generate a modified LMWF 106, such that at least one feature in the pattern defined by the modified LMWF 106 is modified from the one or more features in the pattern defined by the LMWF 102. The at least one modified feature in the pattern incorporates a modification such that the new feature compensates for the non-uniform deposition.

The modified LMWF 106 may be used to perform lithography on a new sample 310, where the modified LMWF 106 provides instructions (e.g., location and dwell times) to a lithography tool. The lithography on a mask 304 defines a pattern 312 including mask features 312-1, 312-2, and 312-3. Mask features 312-1, 312-2, and 312-3, unlike mask features 308-1,2,3, are not of equal dimensions. Rather, mask features 312-1,2,3 are depicted as biased to different dimensions in the mask pattern to achieve deposited features with uniform performance values (e.g., uniform resistance).

For example, in some implementations, the area of overlap between the top and bottom contacts may depend on the height of the bottom contact, which is dependent on the thickness of deposition. For example, a rectangular wire bottom contact has a length, width, and height, wherein the height of the bottom contact is defined, in part, by the thickness of the film deposited at the location of the junction. The rectangular wire may have a top surface and one or more sidewalls. The one or more sidewalls may be defined as having a surface perpendicular to the surface of the substrate, and where the height of the sidewalls is defined by the thickness of the deposited film. An oxide layer promoted on the exposed surfaces of the rectangular wire may then include oxide formation on all exposed surfaces of the rectangular wire, including one or more sidewalls of the wire. Furthermore, a second, top contact (e.g., a rectangular wire) deposited on top of the oxide layer may then overlap the bottom contact (and oxide layer) over multiple exposed surfaces (e.g., a top surface and one or more sidewalls).

Josephson junctions having junction areas which depend, in part, on the thickness of deposition for a bottom contact may compensate for a non-uniformity in thickness by biasing a different dimension in the mask pattern to achieve equal effective junction areas for two of more Josephson junctions across a substrate.

Different forms of modification to a set of instructions in a modified LMWF may be implemented to compensate for various non-uniformities. For example, Josephson junctions deposited across a substrate may have non-uniform junction cross-sectional areas, resulting in non-uniform junction resistances.

In one implementation, an angle of deposition (e.g., angle of the surface of a substrate with reference to a deposition beam) for shadow evaporation of the junctions causes bottom contacts of junctions fabricated at the edge of a substrate to have narrower widths than bottom contacts of junctions fabricated at the center of the substrate. A uniformity function 104 applied to create a modified LMWF 106 may reduce the dimensions of the features towards the center (or widen those at the edge). The resulting junctions deposited using a modified mask would then have improved uniformity in the dimensions of the bottom contacts for the Josephson junctions fabricated across the substrate, with increased resistance uniformity across the substrate.

Though FIG. 3 depicts a uniformity function 104 that includes a linear function for compensating for a linear non-uniformity of deposition, there can be multiple other forms of modifications applied by a uniformity function 104 as mentioned above.

Figure 4:
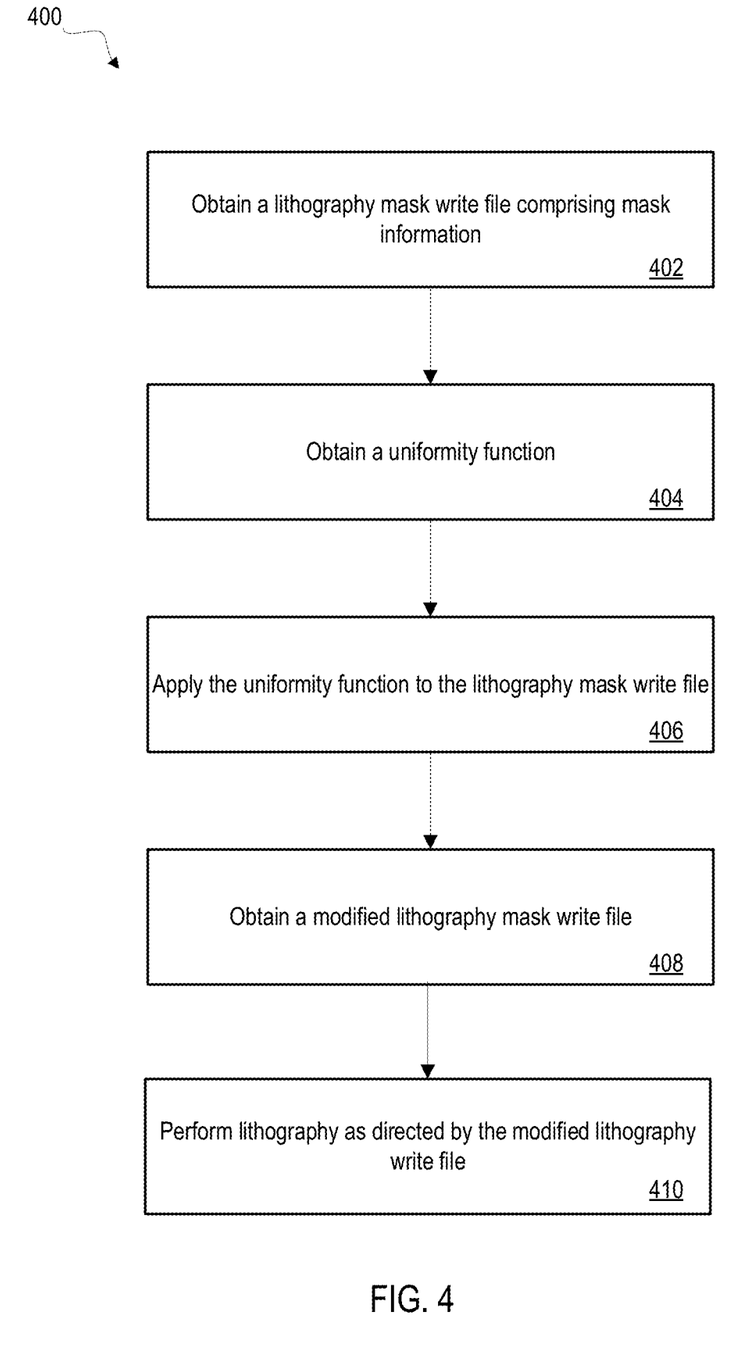
FIG. 4 is a flow chart of an exemplary process of applying a uniformity function to a lithography mask write file.

FIG. 4 is a flow chart of an example process 400 for applying a uniformity function to a lithography mask write file. A lithography mask write file (LMWF) 102 including a set of instructions defining a pattern having at least one feature is obtained (402). For example, the instructions in a LMWF 102 may be used to perform lithography on a mask for use in fabricating a set of Josephson junctions on a sample (e.g., a substrate). The fabrication process involves at least two depositions using a shadow evaporation process, the fabrication process having a set of deposition parameters 210. Each of the deposition parameters may have a non-uniformity effect on deposition of the set of Josephson junctions on the sample.

A uniformity function 104 is obtained (404) from an empirical function 214, a geometric function 218, or a combination thereof. In some implementations, the uniformity function 104 is obtained (404) by a data processing apparatus. The uniformity function 104 compensates for the non-uniformity deposition effects resulting from the deposition parameters 210 used in the fabrication process by modifying a LMWF 102 to generate a modified LMWF 106. For example, a short source-to-substrate distance in a deposition tool (e.g., an electron beam evaporation system) may cause a radially-dependent non-uniformity where thickness of deposition varies radially outward from the center of the substrate. Additionally, an offset in uniformity from the center of the substrate may result from beam location, substrate tilt, substrate offset from center, or the like.

The uniformity function 104 is applied to the LMWF 102 such that a set of one or more features of the pattern defined by the instructions of the LMWF are modified (406). In some implementations, a data processing apparatus applies the uniformity function 104 to the LMWF 102 to modify the instruction of the LMWF (404). Modification of a feature may include changing a dimension (e.g., shortening/lengthening a length of an aperture), shifting a feature (e.g., shifting a location of an aperture relative to the surface of the mask), or altering a three-dimensional aspect of a feature (e.g., increasing/decreasing the angle of a sidewall).

A modified LMWF 106 is obtained (408) from the application of the uniformity function 104 to the LMWF 102. In some implementations, a data processing apparatus may obtain the modified LMWF 106 from the application of the uniformity function 104 to the LMWF 102. The modified LMWF 106 may have some or none of the same instructions from the original LMWF. For example, lithography is performed using the modified LMWF 106 to define a pattern that will be used for shadow evaporation of a superconducting material to form a set of Josephson junctions on the sample substrate.

Figure 5:
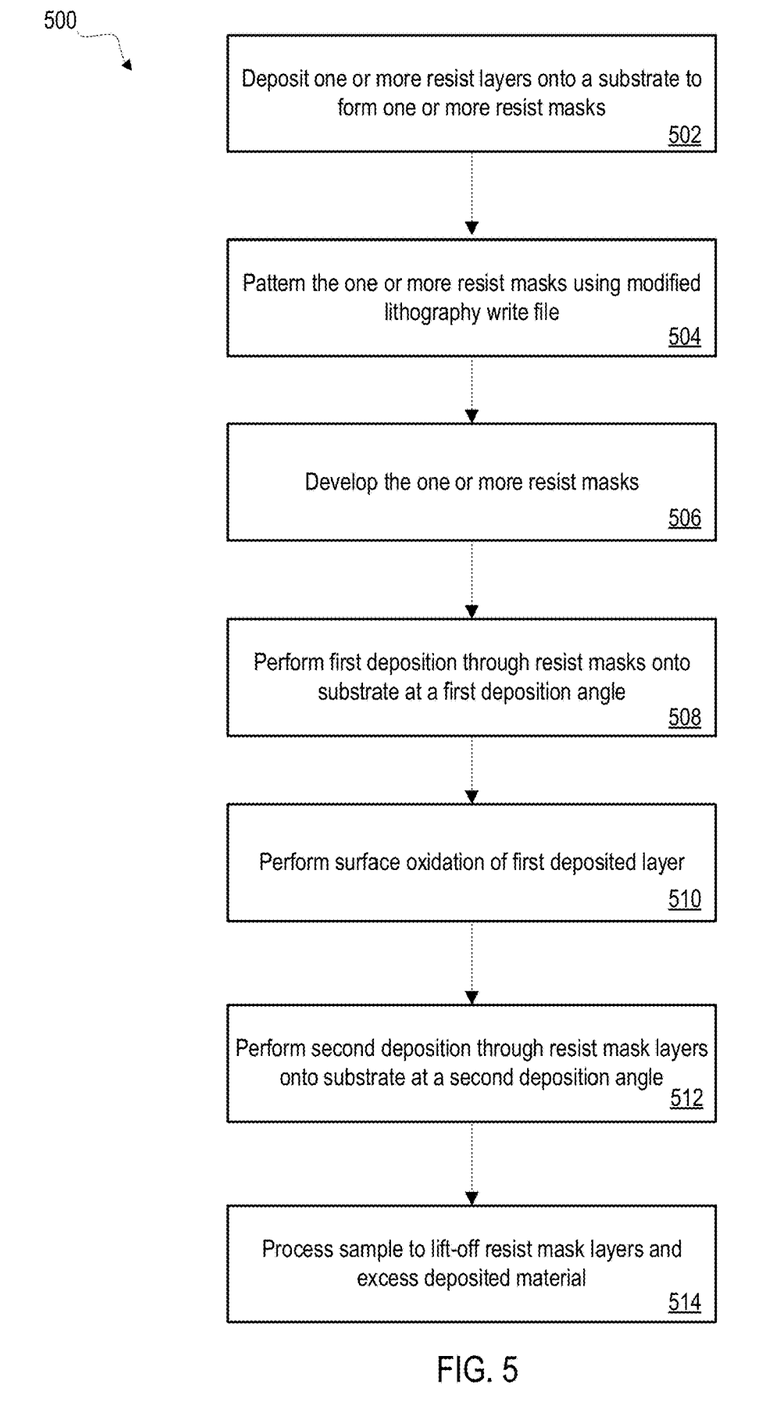
FIG. 5 is a flow chart of an exemplary process of fabricating a set of Josephson junctions with improved junction resistance uniformity.

FIG. 5 is a flow chart of an example process for fabricating a set of Josephson junctions with improved junction resistance uniformity on a sample substrate. One or more resist layers are deposited onto a substrate to form one or more resist masks (502). Deposition of resist layers may be through spin coating. Various compositions of resist may be used including poly(methyl methacrylate) (PMMA). Resists may be positive or negative resists, where the positive resist is exposed in regions that will be removed from the resist mask and negative resist is exposed in all the regions that will be part of the resist mask.

The one or more resist masks are patterned using a modified LMWF (504) as described with reference to FIG. 4. Each mask may be patterned using a different modified LMWF. Each resist mask is developed such that the features defined by the modified LMWF are revealed (506). For example, a square defined by a modified LMWF in a positive resist mask will be developed (e.g., using a developer solution) to wash away the resist that is within the defined feature, exposing a substrate layer underneath. Once the resist mask is defined, the shadow evaporation process proceeds.

One or more depositions are performed in a deposition tool (e.g., electron beam evaporation system, physical vapor deposition system, atomic layer deposition system). A first deposition is performed (508) through the one or more resist masks. The first deposition of a layer of superconducting material may be performed at a first deposition angle on a substrate positioned at a first position in the deposition chamber. For example, a substrate surface deposition angle of 45° degrees (relative to the deposition beam axis) may be selected for the first deposition of a bottom contact of the Josephson junctions.

Following the first deposition, a surface oxidation is performed on the first deposited layer (510). The surface oxidation process may be performed in air or in a controlled environment. The controlled environment may be a separate chamber from the chamber where deposition is occurring. In some implementations, high-purity oxygen is used to promote oxidation of the first deposited layer of superconducting material.

After oxidizing the surface of the first deposited layer, the sample substrate is returned to the deposition tool, and a second deposition through the resist mask layers onto the substrate is performed (512). The second deposition is performed at a second substrate surface deposition angle (relative to the deposition beam axis). In some implementations, the second deposition angle may be orthogonal to the first deposition angle. In some implementations, the substrate is rotated to a second position in the deposition chamber different from the first position.

When the deposition steps are completed, the sample is processed to lift-off the resist mask layers as well as any excess deposition (514). For example, one or more solvents (e.g., acetone), other chemical compounds (resist strippers), ultrasonic immersion, heated bath, or a combination thereof may be used.

In some implementations, some or all of the processes and characterization techniques mentioned above take place in a controlled environment which may include a high-purity vacuum chamber, temperatures below the superconducting temperature of the superconducting material, or a combination there of.

An example of a superconductor material that can be used in the formation of quantum circuit elements is aluminum. Aluminum may be used in combination with a dielectric to establish Josephson junctions, which are a common component of quantum circuit elements. Examples of quantum circuit elements that may be formed with aluminum include circuit elements such as superconducting co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

Aluminum may also be used in the formation of superconducting classical circuit elements that are interoperable with superconducting quantum circuit elements as well as other classical circuit elements based on complementary metal oxide semiconductor (CMOS) circuitry. Examples of classical circuit elements that may be formed with aluminum include rapid single flux quantum (RSFQ) devices, reciprocal quantum logic (RQL) devices and ERSFQ devices, which are an energy-efficient version of RSFQ that does not use bias resistors. Other classical circuit elements may be formed with aluminum as well. The classical circuit elements may be configured to collectively carry out instructions of a computer program by performing basic arithmetical, logical, and/or input/output operations on data, in which the data is represented in analog or digital form.

Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, or lift-off processes.

Implementations of the quantum subject matter and quantum operations described in this specification may be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements may be used to perform quantum processing operations. That is, the quantum circuit elements may be configured to make use of quantum-mechanical phenomena, such as superposition and entanglement, to perform operations on data in a non-deterministic manner. Certain quantum circuit elements, such as qubits, may be configured to represent and operate on information in more than one state simultaneously. Examples of superconducting quantum circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DC-SQUID), among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Figure 2A:
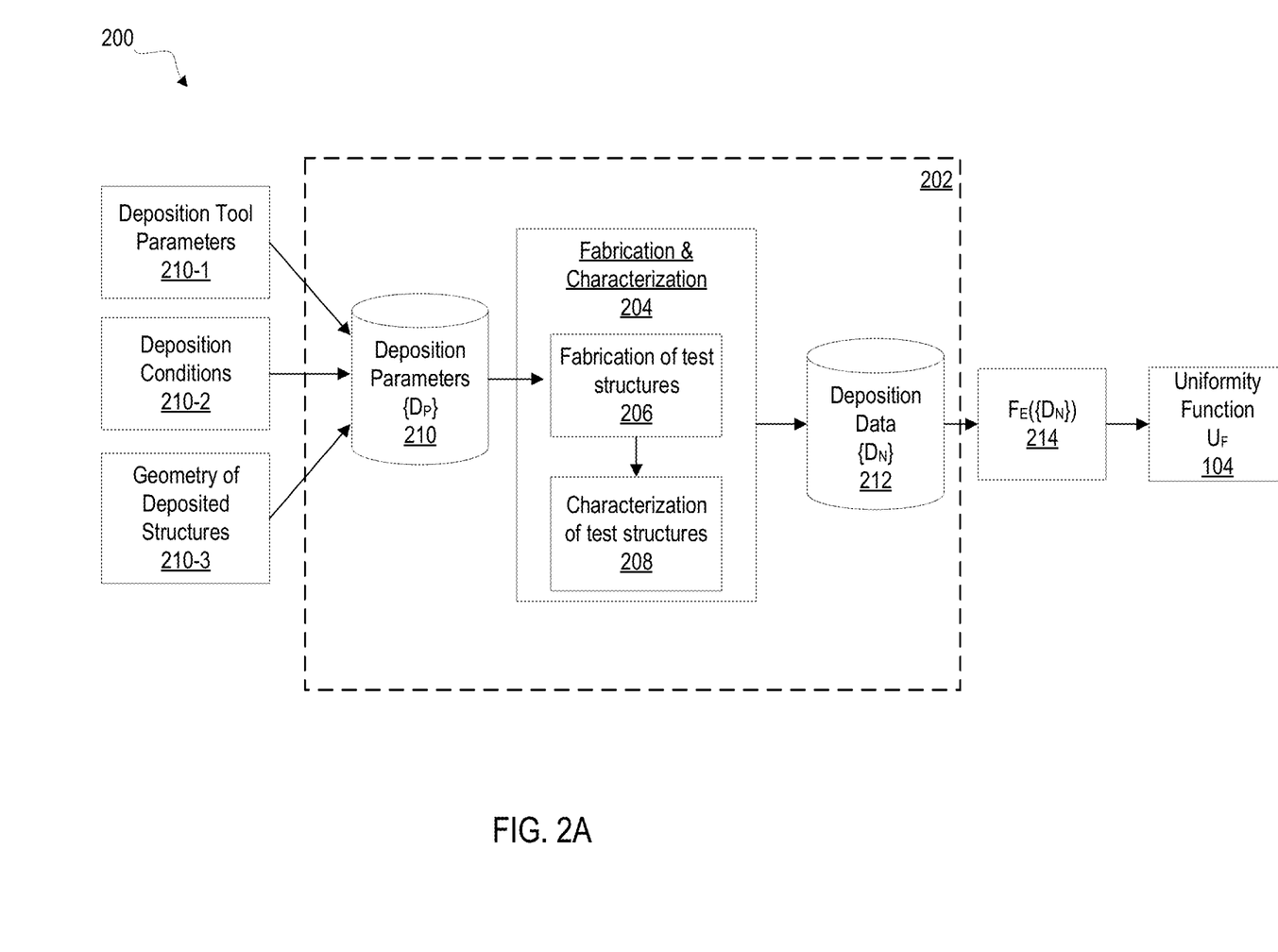
FIG. 2A is a block diagram of an exemplary process for generating a uniformity function from deposition data.
Figure 2B:
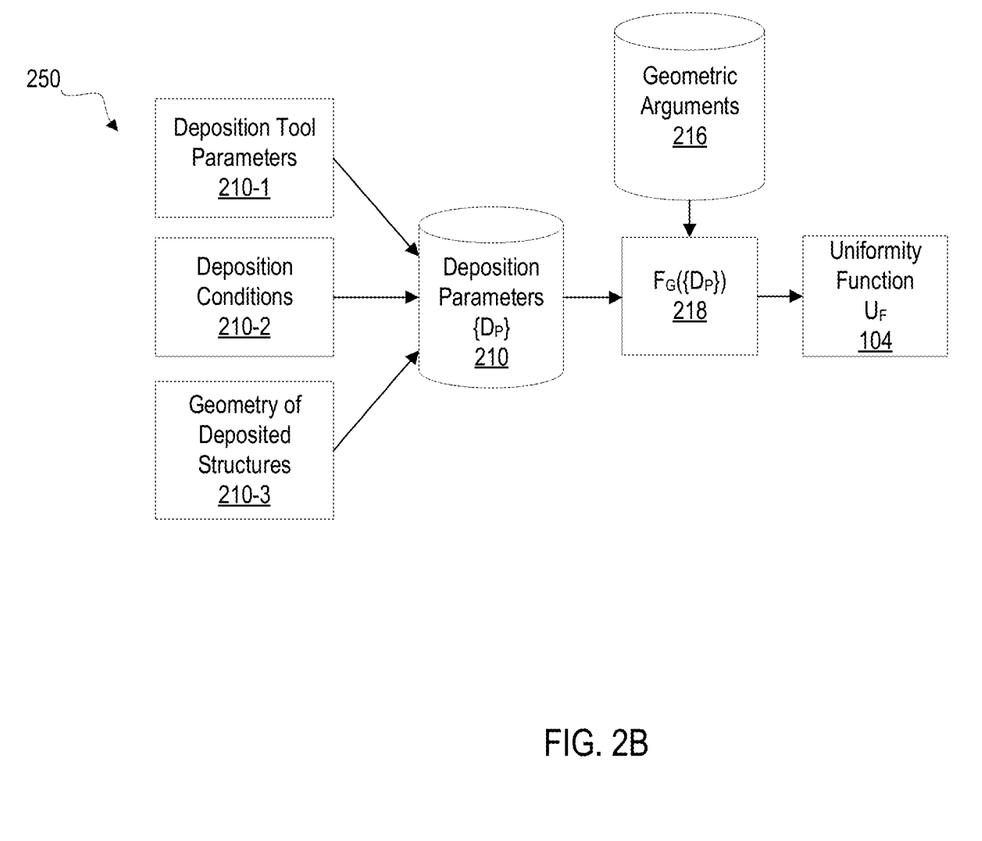
FIG. 2B is a block diagram of an exemplary process for generating a uniformity function from one or more geometric arguments.

One or more processes described herein, such as one or more of the steps of processes illustrated in FIGS. 2A-2B, may be performed by a data processing apparatus. The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a user computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some embodiments, a server transmits data (e.g., an HTML page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any features or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Other implementations are within the scope of the following claims.

What is claimed is:

1. A computer-implemented method of fabricating a circuit element comprising:
   receiving a first lithography mask write file comprising mask information characterizing at least one mask feature;
   generating a uniformity function configured to modify the mask information characterizing the at least one mask feature to compensate for a non-uniform deposition process,
   wherein generating the uniformity function comprises:
   (a) deriving one or more geometric arguments that determine a geometric relationship between a set of one or more deposition parameters and a resulting effect the deposition parameter has on a deposition,
   (b) deriving, from a calibration process, an empirical function that characterizes how deposition data varies as a function of the set of one or more deposition parameters,
   or (c) a combination of (a) and (b);
   applying the uniformity function to the first lithography mask write file to obtain a first modified lithography mask write file; and
   providing the first modified lithography mask write file.

2. The method of claim 1, further comprising:
   receiving a second lithography mask write file comprising mask information characterizing at least one mask feature of the second lithography mask write file that is different from the at least one mask feature of the first lithography mask write file; and
   applying the uniformity function to the second lithography mask write file to obtain a second modified lithography mask write file.

3. The method of claim 1, wherein the first lithography mask write file comprises instructions for patterning of three-dimensional features.

4. The method of claim 1, wherein the first lithography mask write file comprises instructions for defining features of a photomask.

5. The method of claim 1, wherein the uniformity function is configured to modify the mask information characterizing the at least one mask feature to compensate for non-uniformities of a plurality of deposition processes in a multi-deposition fabrication process.

6. The method of claim 5, wherein each of the plurality of deposition processes in the multi-deposition fabrication process comprises a unique non-uniform process variation relative to each other of the plurality of deposition processes in the multi-deposition fabrication process.

7. The method of claim 1, wherein the calibration process for deriving the empirical function comprises fabricating at least one test structure to extract deposition data.

8. A system comprising:
   a data processing apparatus;
   a non-transitory memory storage in data communication with the data processing apparatus and storing instructions executable by the data processing apparatus and that upon such execution cause the data processing apparatus to perform operations comprising:
   receiving a first lithography mask write file comprising mask information characterizing at least one mask feature;
   generating a uniformity function configured to modify the mask information characterizing the at least one mask feature to compensate for a non-uniform deposition process,
   wherein generating the uniformity function comprises:
   (a) deriving one or more geometric arguments that determine a geometric relationship between a set of one or more deposition parameters and a resulting effect the deposition parameter has on a deposition,
   (b) deriving, from a calibration process, an empirical function that characterizes how deposition data varies as a function of the set of one or more deposition parameters,
   or (c) a combination of (a) and (b);
   applying the uniformity function to the first lithography mask write file to obtain a first modified lithography mask write file; and
   providing the first modified lithography mask write file.

9. The system of claim 8, further comprising:
   receiving a second lithography mask write file comprising mask information characterizing at least one mask feature of the second lithography mask write file that is different from the at least one mask feature of the first lithography mask write file; and
   applying the uniformity function to the second lithography mask write file to obtain a second modified lithography mask write file.

10. The system of claim 8, wherein the first lithography mask write file comprises instructions for patterning of three-dimensional features.

11. The system of claim 8, wherein the first lithography mask write file comprises instructions for defining features of a photomask.

12. The system of claim 8, wherein the uniformity function is configured to modify the mask information characterizing the at least one mask feature to compensate for non-uniformities of a plurality of deposition processes in a multi-deposition fabrication process.

13. The system of claim 12, wherein each of the plurality of deposition processes in the multi-deposition fabrication process comprises a unique non-uniform process variation relative to each other of the plurality of deposition processes in the multi-deposition fabrication process.

14. A non-transitory computer readable medium storing instructions which, when executed by data processing apparatus, causes it to perform operations comprising:
   receiving a first lithography mask write file comprising mask information characterizing at least one mask feature;
   generating a uniformity function configured to modify the mask information characterizing the at least one mask feature to compensate for a non-uniform deposition process,
   wherein generating the uniformity function comprises:

(a) deriving one or more geometric arguments that determine a geometric relationship between a set of one or more deposition parameters and a resulting effect the deposition parameter has on a deposition,
(b) deriving, from a calibration process, an empirical function that characterizes how deposition data varies as a function of the set of one or more deposition parameters,
or (c) a combination of (a) and (b);
applying the uniformity function to the first lithography mask write file to obtain a first modified lithography mask write file; and
providing the first modified lithography mask write file.

15. The non-transitory computer readable medium of claim 14, further comprising:
receiving a second lithography mask write file comprising mask information characterizing at least one mask feature of the second lithography mask write file that is different from the at least one mask feature of the first lithography mask write file; and
applying the uniformity function to the second lithography mask write file to obtain a second modified lithography mask write file.

16. The non-transitory computer readable medium of claim 14, wherein the first lithography mask write file comprises instructions for patterning of three-dimensional features.

17. The non-transitory computer readable medium of claim 14, wherein the first lithography mask write file comprises instructions for defining features of a photomask.

18. The non-transitory computer readable medium of claim 14, wherein the uniformity function is configured to modify the mask information characterizing the at least one mask feature to compensate for non-uniformities of a plurality of deposition processes in a multi-deposition fabrication process.

19. The non-transitory computer readable medium of claim 18, wherein each of the plurality of deposition processes in the multi-deposition fabrication process comprises a unique non-uniform process variation relative to each other of the plurality of deposition processes in the multi-deposition fabrication process.

* * * * *